US008023579B2

(12) United States Patent  (10) Patent No.: US 8,023,579 B2
Sano et al. (45) Date of Patent: Sep. 20, 2011

(54) QUADRATURE DEMODULATION DEVICE, QUADRATURE DEMODULATION METHOD, AND QUADRATURE DEMODULATION PROGRAM

(75) Inventors: Kouichi Sano, Ihara-gun (JP); Yasuo Matsumoto, Numazu (JP); Masakazu Kato, Numazu (JP); Takahiro Shimura, Gotemba (JP)

(73) Assignee: Toshiba Tec Kabushiki Kaisha (JP)

( * ) Notice: Subject to any disclaimer, the term of this patent is extended or adjusted under 35 U.S.C. 154(b) by 746 days.

(21) Appl. No.: 12/148,113

(22) Filed: Apr. 16, 2008

(65) Prior Publication Data

US 2008/0231425 A1 Sep. 25, 2008

Related U.S. Application Data (63) Continuation of application No. PCT/JP2007/055094, filed on Mar. 14, 2007.

(30) Foreign Application Priority Data

Mar. 15, 2006 (JP) .................................. 2006-071341

(51) Int. Cl.
H04L 5/12 (2006.01)
H04L 23/02 (2006.01)

(52) U.S. Cl. ........ 375/261; 375/343; 375/341; 375/262; 375/342; 455/41.1; 455/41.2; 455/41.3

(58) Field of Classification Search ............... 375/261, 375/316, 340, 343, 341, 262, 342; 340/10.1; 455/41.1–41.3
See application file for complete search history.

(56) References Cited

U.S. PATENT DOCUMENTS

| 6,501,807 | B1 | 12/2002 | Chieu et al. | |
|---|---|---|---|---|
| 7,633,377 | B2 * | 12/2009 | Sadr | 340/10.1 |
| 7,773,945 | B2 * | 8/2010 | Reynolds | 455/41.3 |
| 2002/0063622 | A1 | 5/2002 | Armstrong et al. | |
| 2003/0086505 | A1 | 5/2003 | Nguyen et al. | |
| 2005/0201450 | A1 * | 9/2005 | Volpi et al. | 375/150 |
| 2007/0071036 | A1 * | 3/2007 | Okunev et al. | 370/503 |

FOREIGN PATENT DOCUMENTS

| JP | 11-239078 | 8/1999 |
|---|---|---|
| JP | 2002-185546 | 6/2002 |
| JP | 2004-254069 | 9/2004 |

(Continued)

OTHER PUBLICATIONS

Translation of International Preliminary Report on Patentability for PCT/JP2007/055094 dated Sep. 16, 2008.
U.S. Appl. No. 10/958,680, filed Oct. 6, 2004, Sadatoshi Oishi.
U.S. Appl. No. 11/555,762, filed Feb. 11, 2006, Kouichi Sano.

(Continued)

*Primary Examiner* — Phuong Phu
(74) *Attorney, Agent, or Firm* — Harness, Dickey & Pierce, P.L.C.

(57) ABSTRACT

A quadrature demodulation device effectively utilizes the result of quadrature detection in order to improve demodulation efficiency. The quadrature modulation device includes a quadrature detector DT which performs quadrature detection on a reception signal obtained by receiving a radio wave from a radio frequency identification tag, to generate an in-phase signal and a quadrature-phase signal, and a demodulation circuit DM which detects a preamble of a particular transition pattern in at least one of the in-phase signal and the quadrature-phase signal and which decodes the at least one of the in-phase signal and the quadrature-phase signal to obtain data succeeding the preamble, the demodulation circuit DM further performing error detection on a decoding result to check for errors.

14 Claims, 7 Drawing Sheets

FOREIGN PATENT DOCUMENTS

| | | |
|---|---|---|
| JP | 2006-005651 | 1/2006 |
| WO | 00-63830 | 10/2000 |
| WO | 2005-114893 | 12/2005 |
| WO | 2007-037956 | 4/2007 |

OTHER PUBLICATIONS

U.S. Appl. No. 11/075,822, filed Mar. 9, 2005, Nobuo Murofushi.

U.S. Appl. No. 11/311,372, filed Dec. 20, 2005, Sadatoshi Oishi.

* cited by examiner

QUADRATURE DEMODULATION DEVICE, QUADRATURE DEMODULATION METHOD, AND QUADRATURE DEMODULATION PROGRAM

CROSS REFERENCE TO RELATED APPLICATIONS

This is a Continuation Application of PCT Application No. PCT/JP2007/055094, filed Mar. 14, 2007, which was published under PCT Article 21(2) in Japanese.

This application is based upon and claims the benefit of priority from prior Japanese Patent Application No. 2006-071341, filed Mar. 15, 2006, the entire contents of which are incorporated herein by reference.

BACKGROUND OF THE INVENTION

1. Field of the Invention

The present invention relates to a quadrature demodulation device that performs quadrature detection on a reception signal obtained by receiving a radio wave from, for example, a radio frequency identification (RFID) tag.

2. Description of the Related Art

In recent years, radio frequency identification (RFID) tags have been utilized in various fields. The RFID tag is a kind of responder that makes short distance radio communications with an interrogator. The interrogator transmits a carrier modulated for "interrogation" and a succeeding radio wave that is an unmodulated carrier. The RFID tag responds to the interrogation from the interrogator and performs backscatter modulation to superimpose reply data on the unmodulated carrier. The RFID tag then transmits a radio wave resulting from the modulation to the interrogator. The reply data is a data signal comprising a synchronization signal portion and a succeeding data signal portion which are encoded at a predetermined bit rate. The synchronization signal portion contains a preamble having a particular transition pattern that can be detected by bit synchronization, and the succeeding data signal portion contains data of an identification code.

The interrogator receives the radio wave transmitted by the RFID tag as a reception signal. The interrogator then performs quadrature detection on the reception signal to reproduce the reply data. The quadrature detection is a scheme that enables direct conversion of a reception signal from an antenna into a base band. The quadrature detection involves mixing a local carrier signal having a frequency set equal to the carrier frequency of the reception signal, with the reception signal to generate an in-phase (I) signal with the base band and mixing a signal obtained by shifting the phase of the local carrier signal by 90 degrees with the reception signal to generate a quadrature-phase (Q) signal with the base band. The amplitude of the I signal and the amplitude of the Q signal depend on the difference between the phase of the reception signal and the phase of the local carrier signal. The amplitude of the Q signal is minimized by maximizing the amplitude of the I signal. The amplitude of the Q signal is maximized by minimizing the amplitude of the I signal. Each of the I and Q signals contains a signal component equivalent to the above reply data together with a noise component involved in radio transmission.

The following interrogator has been known. The interrogator compares each of the I and Q signals with a particular transition pattern provided for preamble detection. Upon detecting that both the I and Q signals have a preamble matching the particular transition pattern, the interrogator decodes the I and Q signals in order to obtain data succeeding the preamble (for example, see U.S. Pat. No. 6,501,807 B1).

The preamble may be incorrectly detected. Consequently, the interrogator described in the above publication is configured to avoid performing the decoding if the interrogator has failed to detect the preamble in one of the I and Q signals. Thus, if only the preamble of the I signal is detected, even if the I signal can be correctly decoded, the I signal is discarded without being decoded.

BRIEF SUMMARY OF THE INVENTION

The present invention has been made in view of the above problems. An object of the present invention is to provide a quadrature demodulation device, a quadrature demodulation method, and a quadrature demodulation program which effectively utilize the result of quadrature detection in order to improve the demodulation efficiency.

According to a first aspect of the present invention, there is provided a quadrature modulation device which comprises a quadrature detector which performs quadrature detection on a reception signal obtained by receiving a radio wave from a radio frequency identification tag, to generate an in-phase signal and a quadrature-phase signal, and demodulation means for detecting a preamble of a particular transition pattern in at least one of the in-phase signal and the quadrature-phase signal, decoding the at least one of the in-phase signal and the quadrature-phase signal to obtain data succeeding the preamble, and performing error detection on a decoding result to check for errors.

According to a second aspect of the present invention, there is provided a quadrature modulation method which comprises performing quadrature detection on a reception signal obtained by receiving a radio wave from a radio frequency identification tag, to generate an in-phase signal and a quadrature-phase signal, detecting a preamble of a particular transition pattern in at least one of the in-phase signal and the quadrature-phase signal, decoding the at least one of the in-phase signal and the quadrature-phase signal to obtain data succeeding the preamble, and performing error detection on a decoding result to check for errors.

According to a third aspect of the invention, there is provided a quadrature modulation program which comprises allowing a computer to perform an operation of detecting a preamble of a particular transition pattern in at least one of an in-phase signal and a quadrature-phase signal both generated by performing quadrature detection on a reception signal obtained by receiving a radio wave from a radio frequency identification tag, decoding the at least one of the in-phase signal and the quadrature-phase signal to obtain data succeeding the preamble, and performing error detection on a decoding result to check for errors.

According to the above quadrature demodulation device, quadrature demodulation method, and quadrature demodulation program, when the preamble of the particular transition pattern is detected in at least one of the in-phase signal and the quadrature-phase signal, the at least one of the in-phase signal and the quadrature-phase signal is decoded to obtain the data succeeding the preamble. The error detection is further performed on the decoding result in order to check for errors. That is, the in-phase signal and the quadrature-phase signal are decoded not only if the preamble of the particular transition pattern is detected in both the in-phase signal but also if the preamble is detected in only one of the signals. This increases the opportunity of successfully acquiring the data succeeding the preamble. Moreover, the presence or absence of errors can be checked by the error detection performed on the decoding result. Consequently, for example, even if the preamble has been incorrectly detected, the data resulting from the decoding can be kept reliable. Demodulation efficiency is improved by effectively utilizing the result of the quadrature detection as described above.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
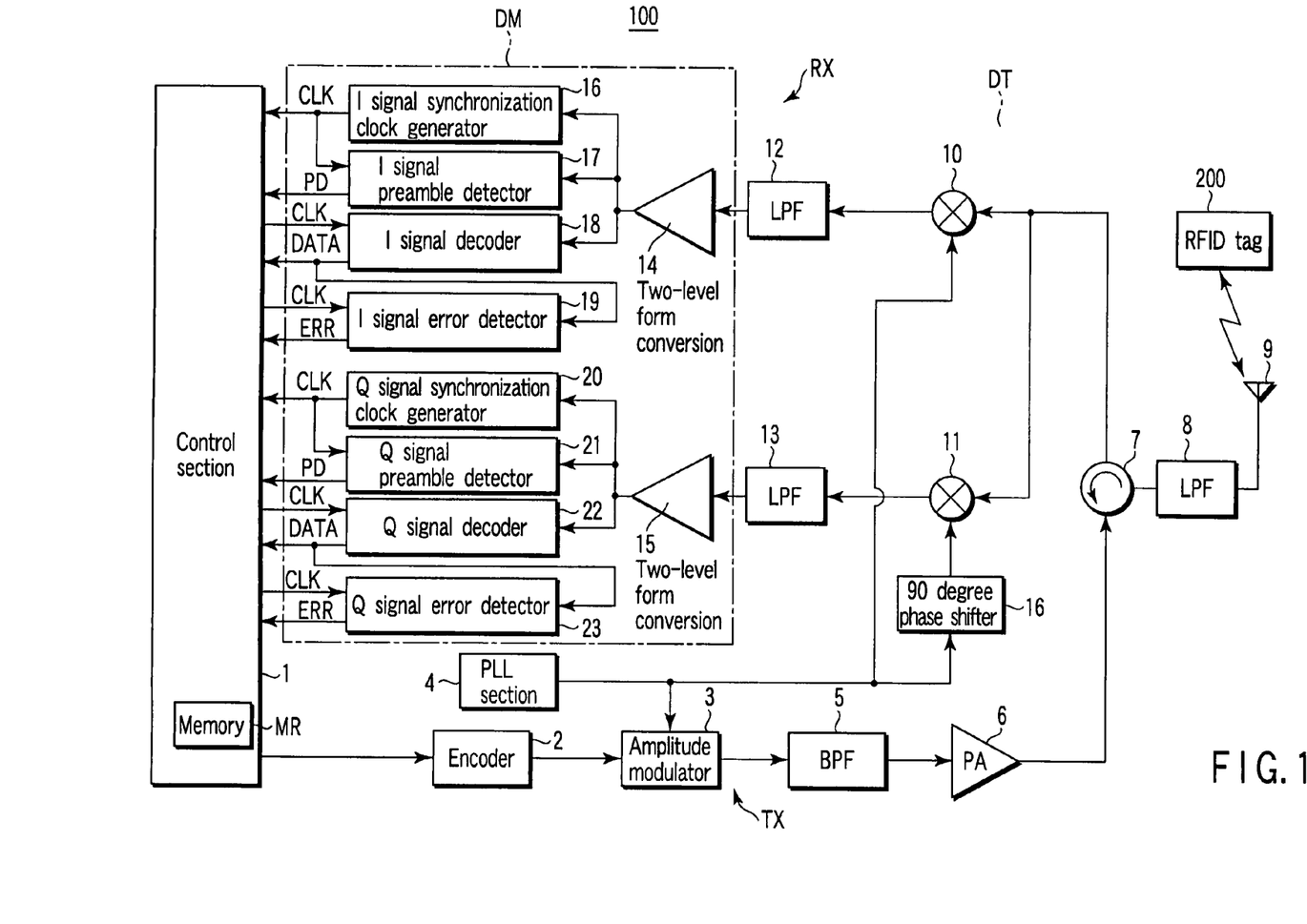
FIG. 1 is a block diagram showing the configuration of an RFID communication system according to a first embodiment of the present invention.

An RFID communication system according to a first embodiment of the invention will be described below with reference to the drawings. FIG. 1 schematically shows the configuration of the RFID communication system. The RFID communication system comprises an interrogator 100 that is also a quadrature demodulation device and an RFID tag 200 that is a kind of responder making short distance communications with the interrogator 100. The RFID tag 200 holds at least identification code data and is attached to a movable object. The RFID tag 200 can also hold data other than the identification code data. The interrogator 100 transmits a carrier modulated for "interrogation" and a succeeding radio wave that is an unmodulated carrier. When the radio wave is emitted to a space outside the interrogator 100 and reaches the RFID tag 200, the RFID tag 200 responds to the interrogation from the interrogator 100 and performs backscatter modulation in which reply data is superimposed on the above unmodulated carrier. The RFID tag 200 then transmits a radio wave resulting from the modulation to the interrogator 100. The reply data is a data signal comprising a series of a synchronization signal portion, a data signal portion, and an error detection signal portion which are encoded at a predetermined bit rate. The synchronization signal portion contains a preamble having a particular transition pattern that can be detected by bit synchronization. The data signal portion contains at least identification code data. The error detection signal portion contains a CRC (Cyclic Redundancy Check) error detection code for the data signal portion. The interrogator 100 receives the radio wave transmitted by the RFID tag 200 as a reception signal. The interrogator 100 then performs quadrature detection on the reception signal to reproduce reply data.

Here, the RFID tag 200 is passive and the interrogator 100 sequentially transmits an unmodulated carrier, a modulated carrier, and an unmodulated carrier. The operation of the RFID tag 200 is activated by the power of the received radio wave from the interrogator 100 regardless of whether or not the carrier is modulated. The operation of the RFID tag 200 is stopped when the received radio wave from the interrogator 100 disappears.

If a plurality of RFID tags 200 are provided, the interrogator 100 can modulate the carrier using an identification code for identification of the RFID tag 200 which should respond to the interrogation, in order to avoid the situation where the RFID tags respond almost simultaneously. Upon demodulating the received radio wave to detect the identification code identifying itself, the RFID tag 200 returns the reply data to the interrogator 100 in the above format. Accordingly, the identification code used for the interrogation may be changed to provide all the RFID tags 3 with opportunities of sequentially returning the reply data.

As shown in FIG. 1, the interrogator 100 comprises a transmission section TX that generates a radio wave to be transmitted for interrogation, and a reception section RX which processes a radio wave which is obtained as a result of modulating a carrier of the transmitted radio wave using reply data and transmitted from the RFID tag 200, as a reception signal. Radio communications between the interrogator 100 and the RFID tag 200 are performed at the same carrier frequency. The interrogator 100 is configured to be able to simultaneously perform transmission of a radio wave to the RFID tag 200 and reception of a radio wave from the RFID tag 200. The transmission section TX and the reception section RX are connected to a directional coupler such as a circulator, which is connected to an antenna 9 via a low pass filter (LPF) 8. The antenna 9 is used to transmit a radio wave to the RFID tag 200 and to receive a radio wave from the RFID tag 200. The directional coupler 7 directs the radio wave output by the transmission section TX to the antenna 9 as a transmission signal. The directional coupler 7 directs the reception signal, the radio wave received by the antenna 9, to the reception section RX. The directional coupler 7 isolates the transmission section TX and the reception section RX from each other. The low pass filter 8 is provided to remove a frequency component exceeding the carrier frequency from the transmission signal and the reception signal.

The interrogator 100 comprises a control section 1 that controls the operation of the whole interrogator 100, a phase locked loop (PLL) section 4 that generates a first local carrier signal of the carrier frequency and a phase shifter 16 that shifts the phase of the first local carrier signal generated by the PLL section 4, by 90 degrees to generate a second local carrier signal. The control section 1 is a computer which includes a memory MR storing data and a control program containing a demodulation control program, and a central processing unit (CPU) operates according to the control program.

The transmission section TX has an encoder 2, an amplitude modulator 3, a band pass filter (BPF) 5, and a power amplifier 6. The encoder 2 encodes transmission data from the control section 1 into a Manchester code or an FM0 code and outputs the encoded data. The Manchester code is obtained by an encoding scheme that provides a rise at the center of the bit for data "0" and a fall at the center of the bit for data "1". In other words, the code of 0,1 represents data "0", whereas the code of 1,0 represents data "1". The FM0 code is obtained by an encoding scheme that provides inversion at every bit boundary and also provides inversion at the center of the bit for data "0". The amplitude modulator 3 mixes the data signal from the encoder 2 with the first local carrier signal from the PLL section 4 to perform amplitude modulation on the local carrier signal serving as a carrier by the data signal and output a radio wave of a high frequency signal obtained by the amplitude modulation. The band of the radio wave is limited by the band pass filter (BPF) 5. The power of the radio wave is further amplified by the power amplifier 6. The resulting radio wave is supplied to the above directional coupler 7. The directional coupler 7 directs the radio wave to the antenna 2 via the low pass filter 8. The radio wave is thus emitted to the external space from the antenna 9.

The reception section RX operates in association with the control section 1 in constituting a quadrature demodulation device that performs quadrature detection on the reception signal obtained by receiving the radio wave from the RFID tag 200. The reception signal is fed from the antenna 9 to the directional coupler 7 via the low pass filter 8 and then directed from the directional coupler 7 to the reception section RX. The reception section RX is composed of a quadrature detector DT which generates an in-phase (I) signal of the base band by mixing the reception signal with the first local carrier signal having a frequency set equal to the carrier frequency of the reception signal and a quadrature-phase (Q) signal of the base band by mixing the reception signal with a second local carrier signal obtained by shifting the phase of the first local carrier signal by 90 degrees to remove carrier components from the reception signal in a direct conversion manner, and a demodulation circuit DM that reproduces reply data from the I signal and Q signal obtained from the quadrature detector DT. The PLL section 4, the phase shifter 16, the mixer 10, and the mixer 11 constitute reception means.

The quadrature detector DT includes the mixers 10 and 11 and the low pass filters (LPF) 12 and 13. The mixer 10 mixes the reception signal with the first local carrier signal to generate the in-phase (I) signal of the base band, and the mixer 11 mixes the reception signal with the second local carrier signal obtained by shifting the phase of the first local carrier signal by 90 degrees to generate the quadrature-phase (Q) signal with the base band. Each of the I and Q signals contains a signal component equivalent to the above reply data together with a noise component involved in radio transmission. The low pass filter 12 removes, from the I signal, a frequency component (noise component) higher than the base band frequency corresponding to the bit rate of the reply data. The low pass filter 13 removes, from the Q signal, a frequency component (noise component) higher than the base band frequency corresponding to the bit rate of the reply data.

The demodulation circuit DM includes binary units 14 and 15, an I signal synchronization clock generator 16, an I signal preamble detector 17 (particular pattern detection means), an I signal decoder 18 (decoding means), an I signal error detector 19 (error detection means), a Q signal synchronization clock generator 20, a Q signal preamble detector 21 (particular pattern detection means), a Q signal decoder 22 (decoding means), and a Q signal error detector 23 (error detection means). The I signal is fed from the low pass filter 12 to the binary unit 14. The Q signal is fed from the low pass filter 13 to the binary unit 15. The binary unit 14 converts the I signal into a two-level form by waveform shaping and outputs the converted I signal to the I signal synchronization clock generator 16, the I signal preamble detector 17, and the I signal decoder 18. The binary unit 15 converts the Q signal into the two-level form by waveform shaping and outputs the converted Q signal to the Q signal synchronization clock generator 20, the Q signal preamble detector 21, and the Q signal decoder 22.

The I signal synchronization clock generator 16 always generates a clock in synchronism with the I signal converted by the binary unit 14, in accordance with a PLL scheme. The I signal synchronization clock generator 16 then outputs the clock to the control section 1 and the I signal preamble detector 17. The I signal preamble detector 17 compares the I signal with a particular transition pattern provided for preamble detection in synchronism with the clock CLK generated by the I signal synchronization clock generator 16. When it is detected as a result that the I signal has a preamble matching the particular transition pattern, the I signal preamble detector 17 outputs a preamble detection signal PD to the control section 1. The control section 1 checks whether or not the preamble detection signal PD has been output by the I signal preamble detector 17, in order to output the clock CLK from the I signal synchronization clock generator 16 to the I signal decoder 18 and the I signal error detector 19. The I signal decoder 18 and the I signal error detector 19 operate on the clock signal CLK generated by the I signal synchronization clock generator 16 and fed via the control section 1. The I signal decoder 18 decodes the I signal by, for example, Manchester decoding or FM0 decoding, which is suitable for an encoding format for the reply data. The I signal decoder 18 outputs the decoding result to the control section 1 and the I signal error detector 19 in bit units. The I signal error detector 19 performs, on data obtained by decoding the I signal, error detection based on a CRC error detection code succeeding the data. When an error in data is detected as a result of the error detection, the I signal error detector 19 outputs an error detection signal ERR to the control section 1.

The Q signal synchronization clock generator 20 always generates a clock in synchronism with the Q signal converted by the binary unit 15, in accordance with the PLL scheme. The Q signal synchronization clock generator 20 then outputs the clock to the control section 1 and the Q signal preamble detector 21. The Q signal preamble detector 21 compares the Q signal with a particular transition pattern provided for preamble detection in synchronism with the clock CLK generated by the Q signal synchronization clock generator 20. When it is detected as a result that the Q signal has a preamble matching the particular transition pattern, the Q signal preamble detector 21 outputs the preamble detection signal PD to the control section 1. The control section 1 checks whether or not the preamble detection signal PD has been output by the Q signal preamble detector 21, in order to output the clock CLK from the Q signal synchronization clock generator 20 to the Q signal decoder 22 and the Q signal error detector 23. The Q signal decoder 22 and the Q signal error detector 23 operate on the clock signal CLK generated by the Q signal synchronization clock generator 20 and fed via the control section 1. The Q signal decoder 22 decodes the Q signal by, for example, the Manchester decoding or FM0 decoding, which is suitable for the encoding format for the reply data. The Q signal decoder 22 outputs the decoding result to the control section 1 and the Q signal error detector 23 in bit units. The Q signal error detector 23 performs, on data obtained by decoding the Q signal, error detection based on the CRC error detection code succeeding the data. When an error in data is detected as a result of the error detection, the Q signal error detector 23 outputs the error detection signal ERR to the control section 1.

When the decoding results obtained from the decoders 18 and 22 contain a predetermined number of bits corresponding to the sum of the data and CRC error detection code, the control section 1 checks whether the error detectors 19, 23 have output the error detection signal ERR as the error detection result. The control section 1 thus confirms presence or absence of errors in data obtained as the decoding result.

Figure 2:
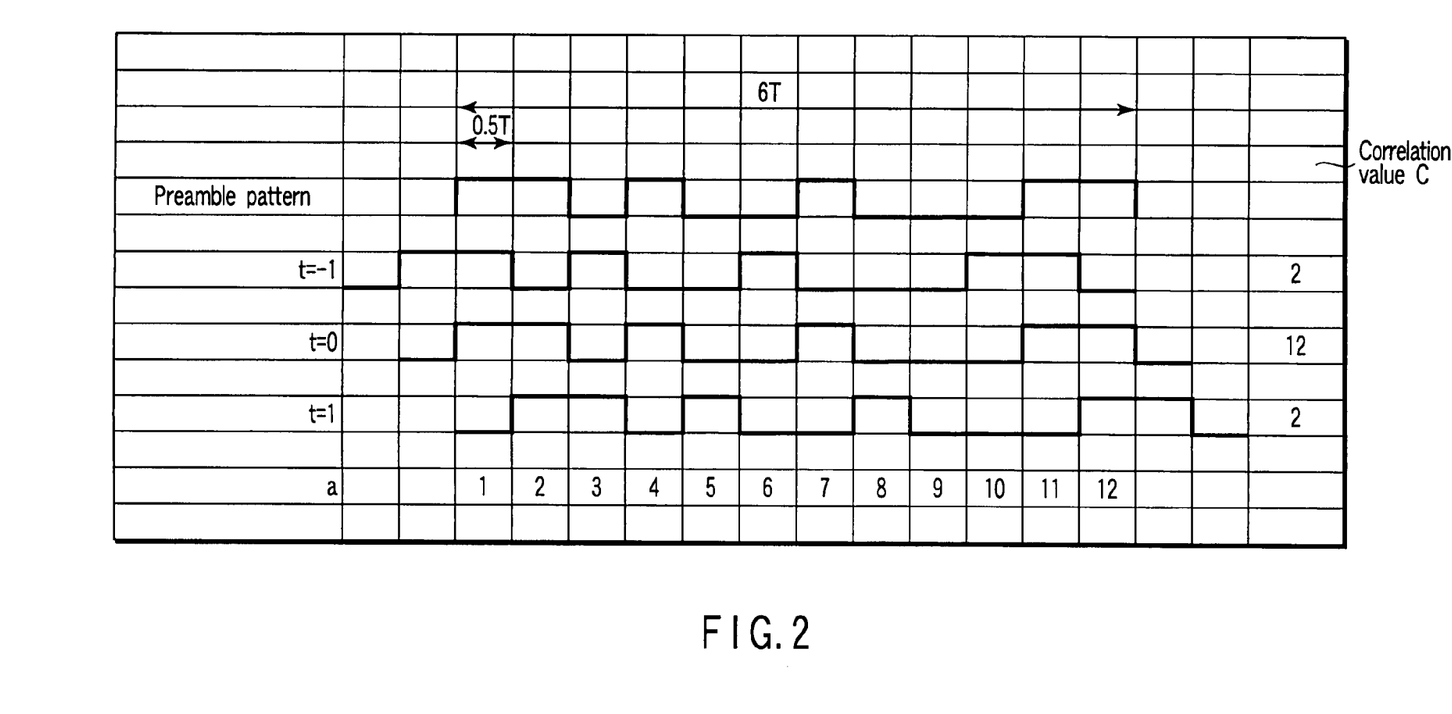
FIG. 2 is a waveform diagram illustrating the operation of a preamble detector shown in FIG. 1.

For example, a preamble pattern shown in FIG. 2 is preset in the preamble detectors 17 and 21 as the particular transmission pattern for the preamble to be detected. In FIG. 2, the phase of an input signal waveform matching the preamble pattern is shown as a time t=0. The phase of an input signal waveform advanced by 0.5 T from the preamble pattern is shown as a time t=−1. The phase of an input signal waveform delayed by 0.5 T from the preamble pattern is shown as a time t=1. The input signal waveform is represented as 1 at a high level and as −1 at a low level. A correlation value for the input signal waveform for the preamble pattern is calculated.

When the preamble pattern is defined as f(a) and the input signal is defined as r(a) and (a) is assumed to be a natural number from 1 to 12, the correlation value c is obtained by:

$$C = \left| \sum_{a=1}^{12} (f(a) \times r(a)) \right|$$

As seen in FIG. 2, pattern matching results in a larger correlation value c. Further, even with a partial error in the waveform of the input signal, a comparatively large correlation value allows the preamble to be detected on the assumption that the input signal waveform matches the preamble pattern. A threshold for preamble detection is set equal to, for example, the correlation value c=10. In this case, the device checks whether or not the correction value c is at least 10 in order to output the preamble detection signal PD.

The CRC error detection code is prepared for the RFID tag 200 in order to allow the detection of errors in the identification code data.

When the identification code data is assumed to be transmission data Sd, the remainder Rd of the division of the transmission data Sd by a generator polynominal is appended to the transmission data Sd as a CRC error detection code. Accordingly, data with a predetermined number of bits (Sd+Rd) is divisible by the generator polynominal. In this case, the addition and the subtraction are equivalent to the logical operation EXCLUSIVE OR.

The RFID tag 200 continuously encodes (Sd+Rd) and convolutes the encoded (Sd+Rd) on the carrier by backscatter modulation. The RFID tag 200 then transmits the resulting radio wave. If the radio wave is not substantially affected by noise when received by the interrogator 100 and then subjected to quadrature detection as a reception signal for decoding, the data (Sd+Rd) resulting from the decoding is divisible by the generator polynominal. If there is any error in the data (Sd+Rd) resulting from the decoding, the division by the generator polynominal results in a remainder. Therefore, the error detection can be performed on the basis of the generation of the remainder.

Specifically, given that the transmission data Sd=1010 and the generator polynominal $fx=x^{16}+x^{12}+x^5+1$ (the corresponding data sequence is 10001000000100001), the remainder Rd of the division of Sd by the generator polynominal fx is as follows. That is, since the generator polynominal fx is of 16 degrees, the remainder Rd is made of 16 bits. Given that Rd=1010000101001010, (Sd+Rd)=10101010000101001010. This is divisible by the generator polynominal fx.

Figure 3:
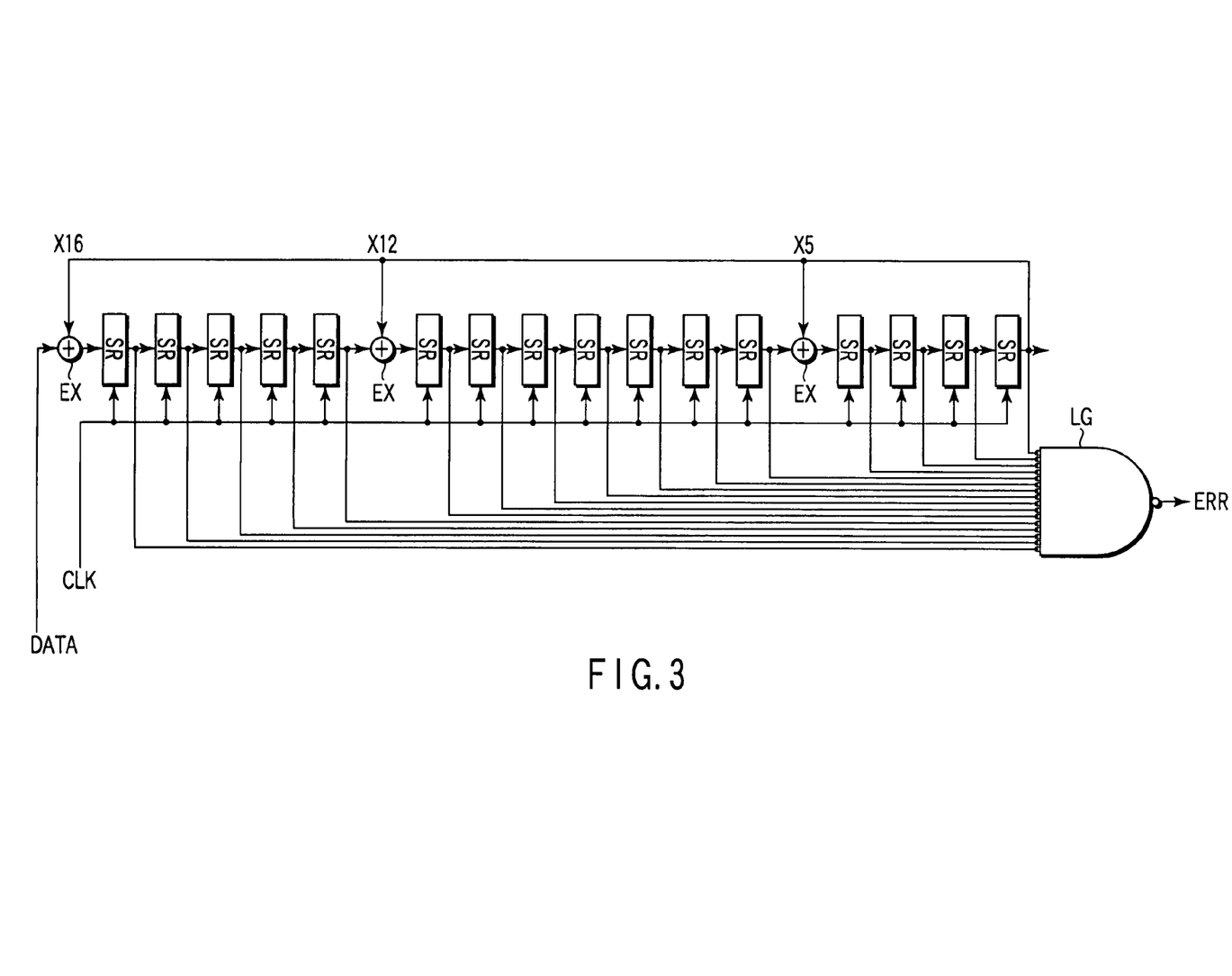
FIG. 3 is a diagram showing an example of the configuration of an I signal error detector and a Q signal error detector both shown in FIG. 1.

The interrogator 100 performs the error detection by using a processor to execute the division or using hardware corresponding to the generator polynominal. The error detectors 19 and 23, shown in FIG. 1, are provided to implement the hardware method. Each of the error detectors 19 and 23 is composed of, for example, 16 shift registers SR connected in series, three exclusive ORs EX interposed among the shift registers SR, and an AND circuit LG connected to output terminals of the shift registers SR, as shown in FIG. 3. An output of the final shift register is fed back as inputs of the exclusive ORs EX. The shift registers SR are connected together so as to receive the clock CLK and to perform shift operations in synchronism with the clock CLK. (Sd+Rd) is input to the initial shift register as a decoding result DATA in units of one bit. Once all of the 16 bits of (Sd+Rd) are input, a remainder is obtained from the output terminals of the shift registers SR. When any of the shift registers SR outputs a remainder of "1", the AND circuit LG outputs the error detection signal ERR.

To make radio communications with the RFID tag 200, the interrogator 100 configured as described above first transmits a radio wave that is an unmodulated carrier to the RFID tag 100 to supply power. At this time, an output from the encoder 2 is maintained at the high level. The amplitude modulator 3 outputs the first local carrier signal generated by the PLL section 4 with its maximum amplitude maintained, as the unmodulated carrier. The unmodulated carrier is supplied to the power amplifier 6 via the band pass filter 5. Unwanted frequency components not belonging to the carrier band are removed when the unmodulated carrier passes through the band pass filter 5. The power of the unmodulated carrier is amplified by the power amplifier 6. The resulting unmodulated carrier is directed to the antenna 9 via the low pass filter 8 by the directional coupler 7. Unwanted frequency components exceeding the carrier frequency are removed when the unmodulated carrier passes through the low pass filter 8. A radio wave that is the resulting unmodulated carrier is transmitted from the antenna 9 to the RFID tag 200.

Further, when the interrogator 100 uses an identification code to designate an RFID tag 200 which should respond to interrogation, data of the identification code is supplied to the encoder 2 by the control section 1. The encoder 2 then encodes the data by, for example, the Manchester code or FM0 code. The amplitude modulator 3 uses the data from the encoder to modulate the amplitude of the first local carrier signal generated by the PLL section 4. The amplitude modulator 3 then outputs the resulting modulated carrier. This modulated carrier is supplied to the power amplifier 6 via the band pass filter 5. Unwanted frequency components not belonging to the carrier band are removed when the modulated carrier passes through the band pass filter 5. The power of the modulated carrier is amplified by the power amplifier 6. The resulting carrier is directed to the antenna 9 via the low pass filter 8 by the directional coupler 7. Unwanted frequency components exceeding the carrier frequency are removed when the modulated carrier passes through the low pass filter 8. A radio wave that is the resulting modulated carrier is transmitted from the antenna 9 to the RFID tag 200.

Subsequently, the interrogator 100 performs transmission of the radio wave, the unmodulated carrier, which transmission is required for backscatter modulation, in a form similar to that described above. The RFID tag 200 responds to the radio wave from the interrogator 100 to perform backscatter modulation on the unmodulated carrier transmitted by the interrogator 100 as the radio wave. In this case, the unmodulated carrier is subjected to the backscatter modulation using the reply data. As described above, the reply data is the data signal comprising a series of the synchronization signal portion, the data signal portion, and the error detection signal portion which are encoded at the predetermined bit rate. The synchronization signal portion contains the preamble having the particular transition pattern that can be detected by bit synchronization. The succeeding data signal portion contains at least identification code data. The error detection signal portion contains the CRC (Cyclic Redundancy Check) error detection code for the data signal portion. The preamble data, the identification code data, and the CRC error detection code are preheld in the RFID tag 200. The RFID 200 transmits the modulated carrier resulting from the backscatter modulation to the interrogator 100 as a radio wave.

Upon being received by the antenna 9 of the interrogator 100, the radio wave from the RFID tag 200 is supplied to the directional coupler 7 via the low pass filter 8 as a reception signal. The directional coupler 7 then directs the radio wave to the mixers 10 and 11. The mixer 10 mixes the reception signal with the first local carrier signal from the PLL section 4 to generate an I signal. The mixer 11 mixes the reception signal with the second local carrier signal from the phase shifter 16 to generate a Q signal. The low pass filter 12 then removes unwanted high frequency components from the I signal from the mixer 10 and supplies the resulting I signal to the binary unit 14. The low pass filter 13 removes unwanted high frequency components from the Q signal from the mixer 11 and supplies the resulting Q signal to the binary unit 15.

The I signal converted into the two-level form by the binary unit 14 is supplied to the I signal synchronization clock generator 16, the I signal preamble detector 17, and the I signal decoder 18. The Q signal converted into the two-level form by the binary unit 15 is supplied to the Q signal synchronization clock generator 20, the Q signal preamble detector 21, and the Q signal decoder 22. The I signal preamble detector 17 calculates the correlation between the I signal and the preset preamble pattern and compares the correlation value with the threshold to detect the preamble of the I signal. The Q signal preamble detector 21 calculates the correlation between the Q signal and the preset preamble pattern and compares the correlation value with the threshold to detect the preamble of the Q signal. The I signal error detector 19 performs error detection on the result of decoding of the I signal obtained from the I signal detector 18. The Q signal error detector 23 performs error detection on the result of decoding of the Q signal obtained from the Q signal detector 22.

Figure 4:
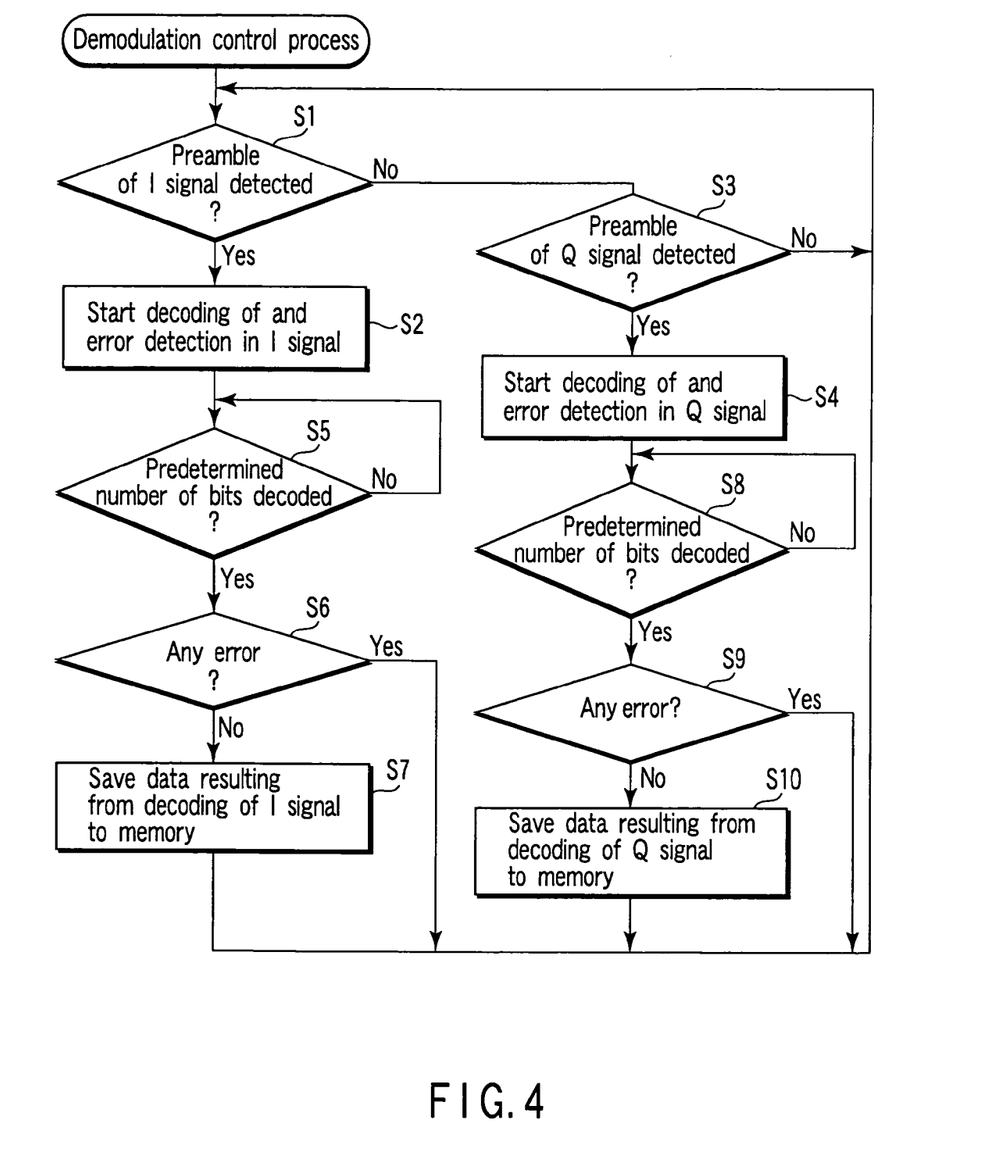
FIG. 4 is a flowchart showing a demodulation control process executed by a control section shown in FIG. 1.

The control section 1 executes a demodulation control process shown in FIG. 4 on the demodulation circuit DM. In step S1, the control section 1 checks whether or not the preamble detector 17 has detected the preamble of the I signal. When the preamble is detected, in step S2, the control section 1 instructs the I signal decoder 18 and the I signal error detector 19 to start decoding of the I signal and detection of a possible error in the decoding result, respectively.

When the preamble of the I signal is not detected in step S1, the control section 1 checks in step S3 whether or not the Q signal preamble detector 21 has detected the preamble of the Q signal. When the preamble of the Q signal is detected, in step S4, the control section 1 instructs the Q signal decoder 22 and the Q signal error detector 23 to start decoding of the Q signal and detection of a possible error in the decoding result, respectively.

That is, even if each of the preamble detectors 17, 21 can detect the preamble, that is, the particular transition pattern, a predetermined one of the two signals, that is, the I signal, is preferentially decoded.

In step S5 following step S2, the control section 1 checks whether or not the I signal has been decoded by a predetermined number of bits (that is, a total number of bits in Sd+Rd). Once the control section 1 determines that this decoding has been completed, the control section 1 checks in step S6 whether or not the I signal error detector 19 has detected any error in the decoding result. If the control section 1 determines that no error has been detected, the data Sd on the I signal decoding result is saved to the memory MR.

In step S8 following step S4, the control section 1 checks whether or not the Q signal has been decoded by a predetermined number of bits (that is, a total number of bits in Sd+Rd). Once the control section 1 determines that this decoding has been completed, the control section 1 checks in step S9 whether or not the Q signal error detector 23 has detected any error in the decoding result. If the control section 1 determines that no error has been detected, the data Sd on the Q signal decoding result is saved to the memory MR.

In the first embodiment, when the preamble is detected in one of the I and Q signals, the signal in which the preamble has been detected is decoded in order to obtain data succeeding the preamble. Further, error detection is performed on the decoding result in order to check for errors. That is, the decoding is performed if the preamble has been detected in at least one of the I and Q signals. This increases the opportunity of successfully acquiring the data succeeding the preamble. Moreover, the presence or absence of errors can be checked by the error detection performed on the decoding result. This makes it possible to improve the reliability of the data resulting from the decoding even if, for example, the preamble is incorrectly detected. Demodulation efficiency is improved by effectively utilizing the result of the quadrature detection as described above.

Figure 5:
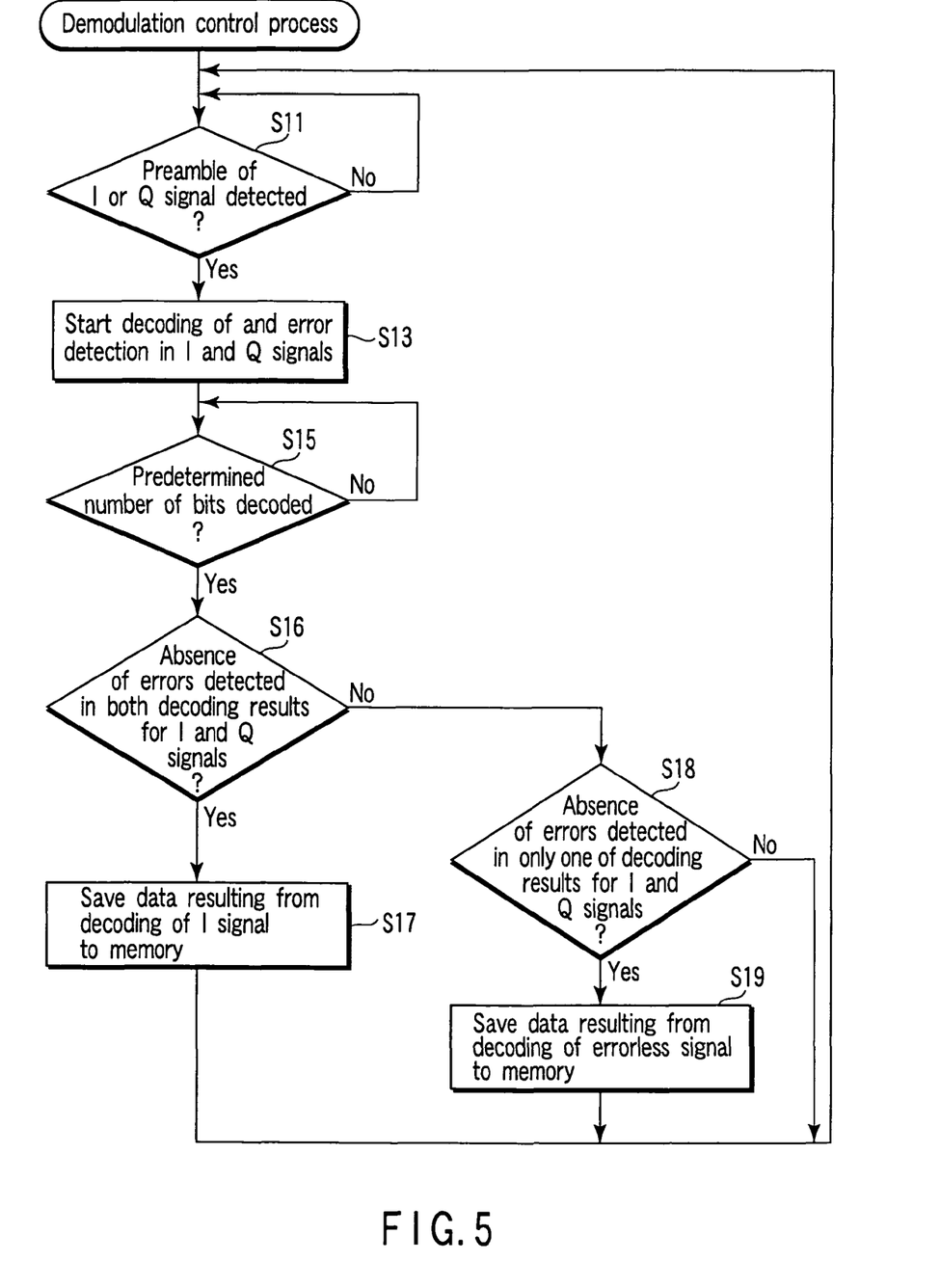
FIG. 5 is a flowchart showing a demodulation control process executed by a modification of the control section shown in FIG. 1.

In the present embodiment, the control section 1 constitutes demodulation means together with the demodulation circuit DM. When the preamble of the I signal is detected, the control section 1 executes the demodulation control process of starting decoding of the I signal and detection of a possible error in the decoding result without checking whether or not the preamble of the Q signal has been detected. However, for example, the control section 1 may execute a demodulation control process of decoding any of the I and Q signals in which the preamble has been detected first and then performing error detection on the decoding result as shown in FIG. 5.

In this modification, while detection of the preamble of the I signal is being preformed in parallel with detection of the preamble of the Q signal, the control section 1 checks in step S11 whether or not the preamble of the I or Q signal has been detected. Once the preamble of the I or Q signal is detected, in step S13, the control section 1 instructs the decoders 18, 22 and the error detectors 19, 23 to start decoding of the I and Q signals and detection of a possible error in the decoding result, respectively. In step S15, the control section 1 checks whether or not the I and Q signal have been decoded by a predetermined number of bits (that is, a total number of bits in Sd+Rd). Once this decoding is completed, the control section 1 checks in step S16 whether or not the absence of errors has been detected in both decoding results for the I and Q signals. If the absence of errors has been detected in both decoding results for the I and Q signals, then in step S17, the control section 1 saves the data Sd resulting from the decoding of a predetermined one of the two signals, for example, the I signal, to the memory MR. Instead of the predetermined one of the two signals, one of the signals, which is determined earlier to have no errors, may be saved to the memory MR. On the other hand, if the absence of errors has not been detected in both decoding results for the I and Q signals, the control section checks in step S18 whether or not the absence of errors has been detected in only one of the decoding results for the I and Q signals. If the absence of errors has been detected in only one of the decoding results for the I and Q signals, then in step S19, the control section 1 saves the data Sd obtained from the decoding result with no errors, to the memory MR.

In this modification, when the preamble is detected in at least one of the I and Q signals, decoding of the I and Q signals and detection of a possible error in the decoding result are started. In this case, no error may be detected in the modulation result for the signal in which the preamble has not been detected. This increases the opportunity of successfully acquiring data succeeding the preamble, improving the modulation efficiency.

Figure 6:
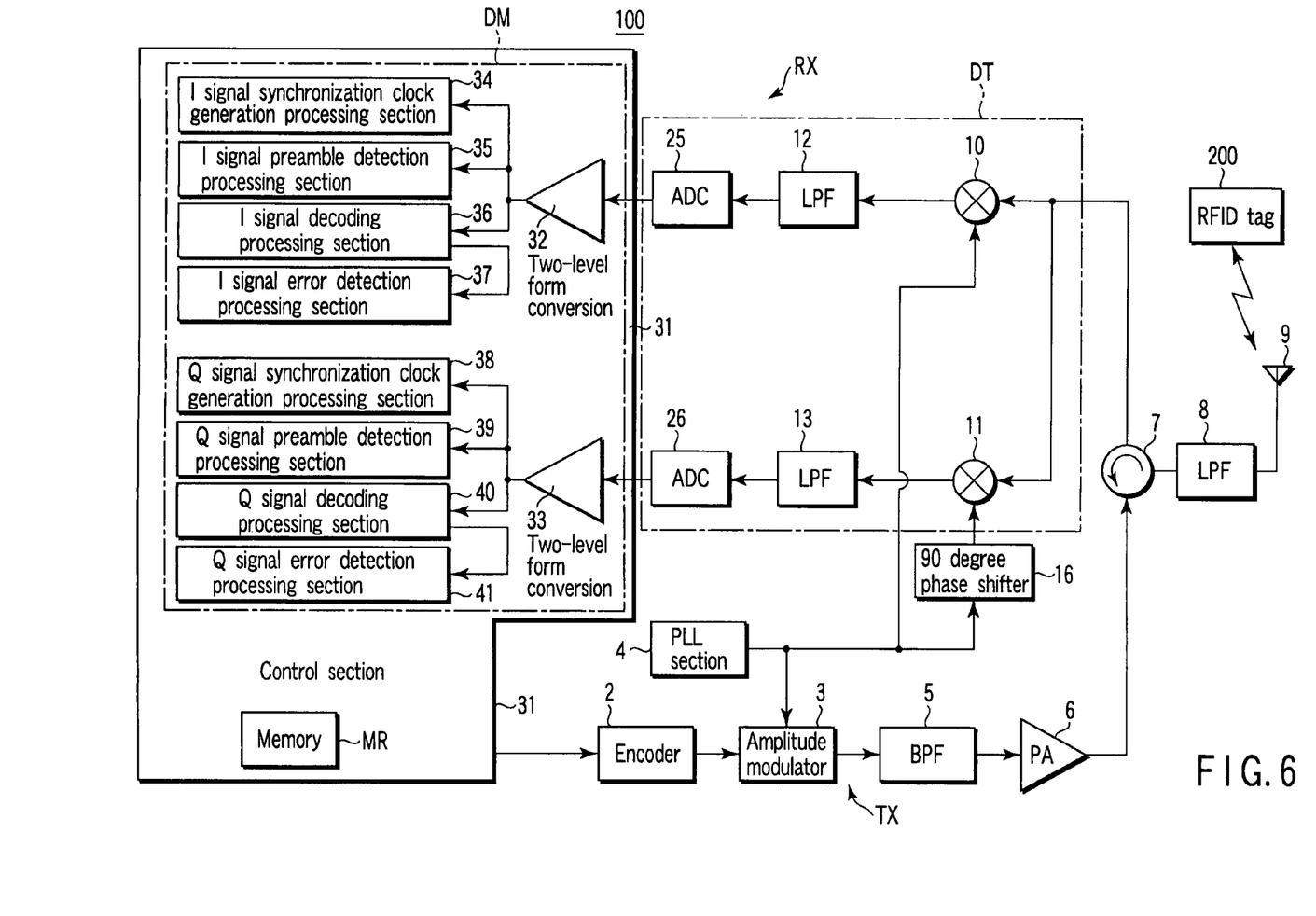
FIG. 6 is a block diagram showing the configuration of an RFID communication system according to a second embodiment of the present invention.

Now, an RFID communication system according to a second embodiment of the present invention will be described. FIG. 6 shows the configuration of the RFID communication system. The RFID communication system includes a control section 31 having a demodulation circuit DM incorporated therein as a part which mainly corresponds to that of the first embodiment and performs at least decoding of the I and Q signals and detection of a possible error in the decoding result using software and hardware logic. Components of the second embodiment similar to those of the first embodiment are denoted by the same reference symbols and will not be described in detail.

The quadrature detector DT has an analog/digital converter (ADC) 25 that converts the I signal output by the low pass filter 12 into a digital format and an analog/digital converter (ADC) 26 that converts the Q signal output by the low pass filter 13 into a digital format.

In the control section 31, a memory MR and the demodulation circuit DM are provided in addition to hardware required for the computer. The demodulation circuit DM comprises binary units 32 and 33, an I signal synchronization clock generation processing section 34, an I signal preamble detection processing section 35, an I signal decoding processing section 36, an I signal error detection processing section 37, a Q signal synchronization clock generation processing section 38, a Q signal preamble detection processing section 39, a Q signal decoding processing section 40, and a Q signal error detection processing section 41, as functions implemented by the control program data stored in the memory MR and the hardware executing the control program data. The binary units 32 and 33, the I signal synchronization clock generation processing section 34, the I signal preamble detection processing section 35, the I signal decoding processing section 36, the I signal error detection processing section 37, the Q signal synchronization clock generation processing section 38, the Q signal preamble detection processing section 39, the Q signal decoding processing section 40, and the Q signal error detection processing section 41 are equivalent to the binary units 14 and 15, I signal synchronization clock generator 16, I signal preamble detector 17, I signal decoder 18, I signal error detector 19, Q signal synchronization clock generator 20, Q signal preamble detector 21, Q signal decoder 22, and Q signal error detector 23 in the demodulation circuit DM, shown in FIG. 1.

Figure 7:
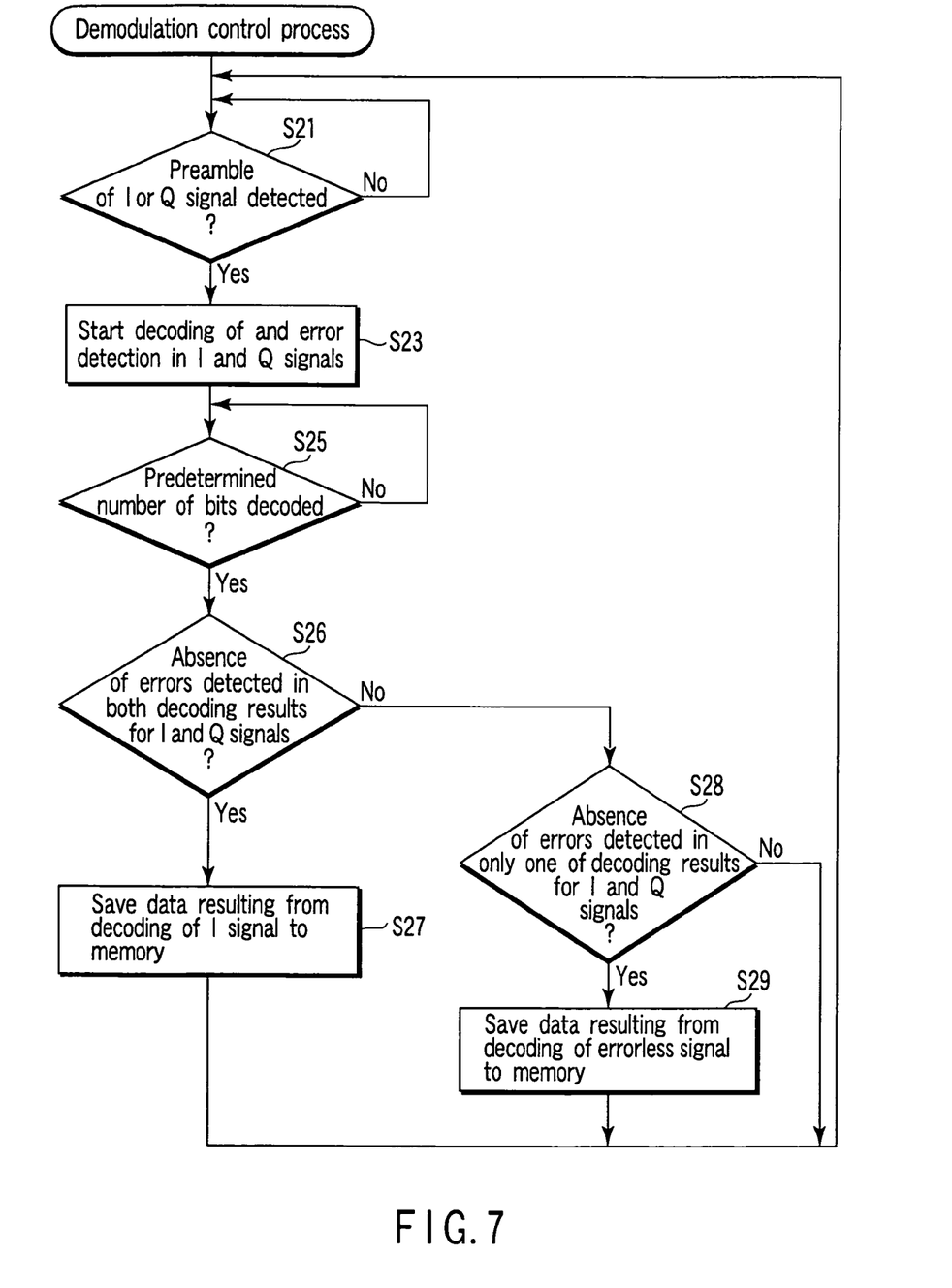
FIG. 7 is a flowchart showing a demodulation control process executed by a control section shown in FIG. 6.

The control section 31 as a whole constitutes demodulation means to execute a demodulation control process shown in FIG. 7 on the above processing section. The demodulation control process is substantially similar to that shown in FIG. 5. While detection of the preamble of the I signal is being preformed in parallel with detection of the preamble of the Q signal, the control section 31 checks in step S21 whether or not the preamble of the I or Q signal has been detected. Once the preamble of the I or Q signal is detected, in step S23, the decoding processing sections 36, 40 and the error detection processing sections 37, 41 start decoding of the I and Q signals and detection of a possible error in the decoding result, respectively. In step S25, the control section 31 checks whether or not the I and Q signal have been decoded by a predetermined number of bits (that is, a total number of bits in Sd+Rd). Once this decoding is completed, the control section 31 checks in step S26 whether or not the absence of errors is detected in both decoding results for the I and Q signals. If the absence of errors is detected in both decoding results for the I and Q signals, then in step S27, the control section 1 saves the data Sd resulting from the decoding of a predetermined one of the two signals, for example, the I signal, to the memory MR. Instead of the predetermined one of the two signals, one of the signals which is determined earlier to have no error may be saved to the memory MR. On the other hand, if the absence of errors is not detected in both decoding results for the I and Q signals, the control section checks in step S28 whether or not the absence of errors has been detected in only one of the decoding results for the I and Q signals. If the absence of errors has been detected in only one of the decoding results for the I and Q signals, then in step S29, the control section 1 saves the data Sd obtained from the decoding result with no error, to the memory MR.

Like the first embodiment, the present embodiment can improve the demodulation efficiency by effectively utilizing the result of the quadrature detection.

As shown in the first and second embodiments, the quadrature demodulation device comprises the reception means for receiving the signal which is transmitted by the radio frequency ID tag and contains the particular pattern and the data and error detection code both succeeding the particular pattern, to generate the I signal from the reception signal and the local signal, while generating the Q signal from the reception signal and the local signal having its phase shifted by 90 degrees, the I signal particular pattern detection means for detecting the particular pattern in the I signal generated by the reception means, the Q signal particular pattern detection means for detecting the particular pattern in the Q signal generated by the reception means, the I signal decoding means for decoding the data succeeding the particular pattern in the I signal detected by the I signal particular pattern detection means, the Q signal decoding means for decoding the data succeeding the particular pattern in the Q signal detected by the Q signal particular pattern detection means, the I signal error detection means for detecting a possible error in the data using the error detection code contained in the I signal decoded by the I signal decoding means, and the Q signal error detection means for detecting a possible error in the data using the error detection code contained in the Q signal decoded by the Q signal decoding means, as shown in the first embodiment. This improves the demodulation efficiency.

In the present embodiment, the demodulation is defined as a process executed on the reception signal from the RFID tag by the interrogator 100 regardless of whether the process is analog or digital. The decoding is defined as a digital portion of the process and does not include the analog process. Therefore, the demodulation circuit DM may be called the first decoding means, and the I signal decoder 18 and the Q signal decoder 22 may be collectively called the second decoding means.

In the description of the present embodiment, the functions for implementing the present invention are prerecorded in the device. However, the present invention is not limited to this. Similar functions may be downloaded into the device from a network or a recording medium in which similar functions are stored may be installed in the device. The recording medium may be any form of medium such as CD-ROM in which programs can be stored and from which the device can read data. The functions obtained by the installation or downloading may be implemented in cooperation with the OS (Operating System) or the like inside the device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A quadrature modulation device comprising:
   a quadrature detector which performs quadrature detection on a reception signal obtained by receiving a radio wave from a radio frequency identification tag, to generate an in-phase signal and a quadrature-phase signal;
   demodulation means for detecting a preamble of a particular transition pattern in at least one of the in-phase signal and the quadrature-phase signal, decoding the at least one of the in-phase signal and the quadrature-phase signal to obtain data succeeding the preamble, and performing error detection on a decoding result to check for errors; and
   wherein the demodulation means is configured to save a predetermined one of the decoding results for the in-phase signal and the quadrature-phase signal when it is confirmed that the absence of errors is detected in both decoding results.

2. The quadrature demodulation device according to claim 1, wherein the demodulation means is configured to decode a predetermined one of the in-phase signal and the quadrature-phase signal.

3. The quadrature demodulation device according to claim 1, wherein the demodulation means is configured to decode one of the in-phase signal and the quadrature-phase signal in which the preamble is detected earlier.

4. The quadrature demodulation device according to claim 1, wherein the demodulation means is configured to calculate a correlation between at least one of the in-phase signal and the quadrature-phase signal and the transition pattern and to detect that a value for the correlation is equal to or larger than a predetermined threshold as the preamble.

5. The quadrature demodulation device according to claim 1, wherein the demodulation means is implemented by particular pattern detection means for detecting the preamble of the particular transition pattern in at least one of the in-phase signal and the quadrature-phase signal, decoding means for decoding the at least one of the in-phase signal and the quadrature-phase signal to obtain the data succeeding the preamble, and error detection means for performing error detection on the decoding result to check for errors.

6. A quadrature modulation method comprising:
   performing quadrature detection on a reception signal obtained by receiving a radio wave from a radio frequency identification tag, to generate an in-phase signal and a quadrature-phase signal;
   detecting a preamble of a particular transition pattern in at least one of the in-phase signal and the quadrature-phase signal;
   decoding the at least one of the in-phase signal and the quadrature-phase signal to obtain data succeeding the preamble; and
   performing error detection on a decoding result to check for errors to save a predetermined one of the decoding results for the in-phase signal and the quadrature-phase signal when it is confirmed that the absence of errors is detected in both decoding results.

7. A quadrature demodulation device comprising:
   reception means for receiving a signal transmitted by a radio frequency ID tag and containing a particular pattern and data succeeding the particular pattern, to generate an I signal from the reception signal and a local signal, while generating a Q signal from the reception signal and the local signal having a phase shifted by 90 degrees;
   I signal particular pattern detection means for detecting the particular pattern in the I signal generated by the reception means;
   Q signal particular pattern detection means for detecting the particular pattern in the Q signal generated by the reception means;
   decoding means for decoding the data succeeding the particular pattern detected by one of the particular pattern detection means; and
   means for performing error detection on a decoding result to check for errors to save a predetermined one of the decoding results for the in-phase signal and the quadrature-phase signal when it is confirmed that the absence of errors is detected in both decoding results.

8. A quadrature modulation device comprising:
   a quadrature detector which performs quadrature detection on a reception signal obtained by receiving a radio wave from a radio frequency identification tag, to generate an in-phase signal and a quadrature-phase signal; and
   demodulation means for detecting a preamble of a particular transition pattern in at least one of the in-phase signal and the quadrature-phase signal, decoding the at least one of the in-phase signal and the quadrature-phase signal to obtain data succeeding the preamble, and performing error detection on a decoding result to check for errors,
   wherein the demodulation means is configured to save one of the decoding results for the in-phase signal and the quadrature-phase signal in which the absence of errors is detected earlier, when it is confirmed that the absence of errors is detected in both decoding results.

9. The quadrature demodulation device according to claim 8, wherein the demodulation means is configured to decode a predetermined one of the in-phase signal and the quadrature-phase signal.

10. The quadrature demodulation device according to claim 8, wherein the demodulation means is configured to decode one of the in-phase signal and the quadrature-phase signal in which the preamble is detected earlier.

11. The quadrature demodulation device according to claim 8, wherein the demodulation means is configured to calculate a correlation between at least one of the in-phase signal and the quadrature-phase signal and the transition pattern and to detect that a value for the correlation is equal to or larger than a predetermined threshold as the preamble.

12. The quadrature demodulation device according to claim 8, wherein the demodulation means is implemented by particular pattern detection means for detecting the preamble of the particular transition pattern in at least one of the in-phase signal and the quadrature-phase signal, decoding means for decoding the at least one of the in-phase signal and the quadrature-phase signal to obtain the data succeeding the preamble, and error detection means for performing error detection on the decoding result to check for errors.

13. A quadrature modulation method comprising:
   performing quadrature detection on a reception signal obtained by receiving a radio wave from a radio frequency identification tag, to generate an in-phase signal and a quadrature-phase signal;
   detecting a preamble of a particular transition pattern in at least one of the in-phase signal and the quadrature-phase signal;
   decoding the at least one of the in-phase signal and the quadrature-phase signal to obtain data succeeding the preamble; and
   performing error detection on a decoding result to check for errors to save one of the decoding results for the in-phase signal and the quadrature-phase signal in which the absence of errors is detected earlier, when it is confirmed that the absence of errors is detected in both decoding results.

14. A quadrature demodulation device comprising:
   reception means for receiving a signal transmitted by a radio frequency ID tag and containing a particular pattern and data succeeding the particular pattern, to generate an I signal from the reception signal and a local signal, while generating a Q signal from the reception signal and the local signal having a phase shifted by 90 degrees;
   I signal particular pattern detection means for detecting the particular pattern in the I signal generated by the reception means;
   Q signal particular pattern detection means for detecting the particular pattern in the Q signal generated by the reception means; and
   decoding means for decoding the data succeeding the particular pattern detected by one of the particular pattern detection means, and
   means for performing error detection on a decoding result to check for errors to save one of the decoding results for the in-phase signal and the quadrature-phase signal in which the absence of errors is detected earlier, when it is confirmed that the absence of errors is detected in both decoding results.

\* \* \* \* \*